(12) United States Patent
Lagahe et al.

(10) Patent No.: US 8,530,334 B2
(45) Date of Patent: Sep. 10, 2013

(54) PROCESS OF TREATING DEFECTS DURING THE BONDING OF WAFERS

(75) Inventors: Chrystelle Lagahe, Crolles (FR); Bernard Aspar, St. Ismier (FR)

(73) Assignee: Soitec, Bernin (FR)

( * ) Notice: Subject to any disclaimer, the term of this patent is extended or adjusted under 35 U.S.C. 154(b) by 270 days.

(21) Appl. No.: 12/811,203

(22) PCT Filed: Jan. 16, 2009

(86) PCT No.: PCT/EP2009/050480
§ 371 (c)(1),
(2), (4) Date: Jun. 29, 2010

(87) PCT Pub. No.: WO2009/090236
PCT Pub. Date: Jul. 23, 2009

(65) Prior Publication Data
US 2010/0285213 A1    Nov. 11, 2010

(30) Foreign Application Priority Data

Jan. 17, 2008 (FR) ..................... 08 50289

(51) Int. Cl.
*H01L 21/30* (2006.01)
(52) U.S. Cl.
USPC ....................................... 438/458
(58) Field of Classification Search
USPC ........................................ 438/458
See application file for complete search history.

(56) References Cited

U.S. PATENT DOCUMENTS

| | | |
|---|---|---|
| 2005/0029224 A1 | 2/2005 | Aspar et al. |
| 2006/0040470 A1* | 2/2006 | Mohamed et al. ............ 438/458 |
| 2007/0173033 A1 | 7/2007 | Allibert et al. |
| 2007/0200144 A1 | 8/2007 | Aspar et al. |
| 2008/0014712 A1* | 1/2008 | Bourdelle et al. ............ 438/455 |

FOREIGN PATENT DOCUMENTS

| | | |
|---|---|---|
| CN | 101106072 A | 1/2008 |
| EP | 1879220 A2 | 1/2008 |
| KR | 20080006490 A | 1/2008 |
| WO | 03/097552 A1 | 11/2003 |
| WO | 2005/064320 A1 | 7/2005 |
| WO | WO 2005/124826 | * 12/2005 |

OTHER PUBLICATIONS

Bengstsson, S. "Semiconductor wafer bonding: a review of interfacial properties and applications" Jour. of Elec. Mat. vol. 21, Iss. 8, Aug. 1992 pp. 841-862.*
International Search Report, International Patent Application No. PCT/EP2009/050480, mailed Apr. 29, 2009, four (4) pages.
Written Opinion, International Patent Application No. PCT/EP2009/050480, mailed Apr. 29, 2009, five (5) pages.

* cited by examiner

*Primary Examiner* — Kyoung Lee
*Assistant Examiner* — Grant Withers
(74) *Attorney, Agent, or Firm* — TraskBritt

(57) ABSTRACT

The invention concerns a process of preparing a thin layer to be transferred onto a substrate having a surface topology and, therefore, variations in altitude or level, in a direction perpendicular to a plane defined by the thin layer, this process comprising the formation on the thin layer of a layer of adhesive material, the thickness of which enables carrying out a plurality of polishing steps of its surface in order to eliminate any defect or void or almost any defect or void, in preparation for an assembly via a molecular kind of bonding with the substrate.

29 Claims, 2 Drawing Sheets

PROCESS OF TREATING DEFECTS DURING THE BONDING OF WAFERS

CROSS-REFERENCE TO RELATED APPLICATION

This is a national phase entry under 35 U.S.C. §371 of International Patent Application PCT/EP2009/050480, filed Jan. 16, 2009, published in English as International Patent Publication WO 2009/090236 A1, on Jul. 23, 2009, which claims the benefit under Article 8 of the Patent Cooperation Treaty to French Patent Application Serial No. 08 50289, filed Jan. 17, 2008, the entire disclosure of each of which is hereby incorporated herein by this reference.

TECHNICAL FIELD

The invention concerns the field of microelectronics and techniques used in this field to perform a processing of wafers that may notably have components on their surface.

BACKGROUND

In this field of microelectronics, it is of particular importance to be able to perform transfers of thin layers containing circuits. These transfers of thin layers enable, notably, transfer of the circuits onto wafers different than those that were used to produce them.

For example, these wafers may be semiconductor wafers containing electronic components or wafers having properties different from the substrates that were used to produce the components.

In some cases, it is sought to have access to the rear face of the components, the face that rests on a substrate on which or from which they may have been prepared.

A known technique for doing this is illustrated in FIGS. 1A-1D. It consists of bonding a first wafer 2, on which a treated thin layer 5 is formed on the front face, with a second wafer 8, and thinning or removing its substrate 1 on the rear face.

The first wafer 2, or rather its treated thin layer 5, contains, in particular, some circuits 3, 6 (FIG. 1A).

In preparation for a bonding by molecular adhesion with this second wafer 8, in general, a layer 4 of bonding material is deposited on the front face of the thin layer 5 in order to be leveled off and compatible with direct bonding (FIG. 1A). Lacking such a leveled off layer 4, non-bonded zones (corresponding to zones with a topology on the surface of the circuit) may be present at the bonding interface and interfere with the transfer of the thin layer 5.

The second wafer 8 for its part is surface oxidized (FIG. 1B). Reference numeral 10 designates the surface layer of oxide.

The bonding step can then take place after the adhesive layer 4 has been leveled off (FIG. 1C).

Finally, the portion of the first wafer 2 not containing the treated zone is thinned or removed (FIG. 1D), for example, by planing or by chemical etching (dry or wet). The surface 5' of the thin layer 5 containing the circuits 3, 6 is then buried at the bonding interface formed by the bonding layer 4.

In some cases, the thin layer 5 is a layer comprising some circuits 3, 6, which may be very elaborate and may, therefore, be of a very high cost. It is not acceptable to be unable to perform the transfer step onto the second wafer 8 with an efficiency that is equal to, or very close to, 100%.

More generally, the simple fact that there is a bonding defect vertically in line with a chip or a component makes it unusable. The defects may be particles that are present on the surface and difficult to clean or defects buried in the oxide layer.

The presence of defects on the leveled off surface, therefore, causes bonding defects, which greatly affect the yield by making some chips unusable.

For example, after the step illustrated in FIG. 1D, a cutting into individual circuits may be performed along cutting lines such as those indicated by the arrows 11 (FIG. 1D). If defects or voids are present at the bonding interface between the adhesive layer 4 and second wafer 8, this may make the whole of the wafer unusable.

The same problem may appear in the case of a surface that is structured but homogeneous (i.e., not comprising multiple layers and materials of different natures), for example, the surface of at least part of the thin layer 5 without circuits 3, 6, this surface having, however, a topology with defects or voids during bonding.

Furthermore, the problem is posed of finding a novel process to ease the carrying out of the transfer of a layer, such as thin layer 5, which may contain some circuits or components and having a surface topology on a support such as second wafer 8.

DISCLOSURE OF THE INVENTION

The inventors have found that, during an operation of polishing the layer of adhesive material 4 (FIG. 1B), difficulties may present themselves because of the topology that the surface 4' (FIG. 2A) of this layer reproduces according to the initial topology of the thin layer 5.

This surface topology of the thin layer 5 results from differences in level e between the elevated zones and the low zones of this surface, which may correspond to several levels, at different altitudes with respect to an axis perpendicular to the plane of the thin layer 5, for example, to several levels of metal in different zones or, more generally, to different stacks of materials in different zones. These differences in level may be as much as around several μm and are, for example, between 500 nm, or 1 μm, and 5 μm, or less than 10 μm.

The topology of the surface 4' of the adhesive layer 4 is not visible in FIGS. 1A and 1B but is shown in FIG. 2A.

Having regard to the considerable topologies indicated above, which may be as much as 5 μm or 10 μm, the surface 4' is not flat but, as in FIG. 2A, rather very irregular, with peaks 20 and patterns in relief. Some of these peaks or patterns may have a base with a width L between a few μm or tens of μm and approximately 100 μm, for a height h which may be around a few μm.

This surface 4' of the adhesive layer 4 has, therefore, with respect to a mid-plane A-A' whose outline is shown in FIG. 2A, patterns in the form of peaks 20 and patterns in the form of pits 22.

The inventors have shown that, despite the use of a technique of polishing the adhesive layer 4, for example, of the mechanical/chemical type implemented prior to the assembly with the second wafer 8, surface defects, peaks or "voids" 24, 26 may remain, as illustrated in FIG. 2B. The problems already mentioned above, therefore, remain.

FIG. 2B shows in more detail the surface of the layer of adhesive material 4 after the polishing step. The peaks or voids 24, 26, which may have a width or a diameter Ø that may be less than a millimeter or around 1 millimeter, will not make it possible to make a perfect bonding or molecular assembly with the second wafer 8. Thus, defects of the particle type from 0.3 μm to a few μm in height may give rise to bonding defects of around 1 mm to several mm.

To solve this problem, an object of the invention is a process for preparing a layer, for example, a thin layer, to be transferred onto a substrate. This layer may have a surface topology, for example, with a maximum amplitude of between 1 μm and 5 μm. The process comprises the formation on the layer of a layer of adhesive material, for example, an oxide such as a silicon oxide ($SiO_x$) or a silicon oxynitride ($SiO_xN_y$), the thickness of which makes it possible to perform a step of leveling off or planarization (the expressions "planarization" and "leveling off" being considered as equivalent here and in the rest of this document) and/or conditioning its surface, or a plurality of steps of leveling off and/or conditioning its surface, in order to eliminate any defect or any "void," or almost any defect or "void," in preparation for an assembly by a bonding of the molecular kind in order to limit the non-bonded zones.

The adhesive layer preferably has an initial thickness lying between:
- a minimum thickness $E_{min}$ making it possible, after a single leveling off (or planarization) and/or conditioning step, to obtain a good molecular bonding, or are brought in contact without bonding defect or almost without bonding defect; and
- a maximum value $E_{max}$ making it possible, after several polishing steps, to obtain good molecular bonding; that is to say, making it possible to eliminate any defect or "void" or almost any defect or void, with a view to assembly by bonding of the molecular kind.

Preferably, the thickness E of the adhesive layer is also limited to a value that does not risk causing excessively high stresses that may result in a deformation of the wafer on which it is deposited. Typically, a value of E of less than 12 μm corresponds to requirements in the field of treatment of semiconductor wafers.

The initial thickness E is, therefore, chosen so as to be less than 10 μm or 12 μm and preferably greater than 0.5 μm or 3 μm.

The thin layer or adhesive layer may have a surface topology and, therefore, variations in altitude and level, in a direction perpendicular to a plane defined by the thin layer.

The thin layer may comprise some components, for example, of the electronic and/or optical circuit type, and/or of the microsystem type.

A preparation process according to the invention may also comprise an assembly step, preferably via molecular adhesion bonding, with the second wafer, and an identification or detection step, for example, by acoustic microscopy or infrared microscopy, for defects in the contact or bonding interface.

The second wafer and the adhesive layer may be separated if the identification step reveals the presence of one or more defects, liable to be present on the bonding interface, and the adhesive layer undergoes a new step of leveling off and/or conditioning, assembling and detection. This cycle may be recommenced as many times as necessary to obtain good bonding (with no defects or very few defects) by virtue of the fact that the adhesive layer present on the thin layer has a thickness $E_{min}$.

Another object of the invention is, therefore, a process of preparing a layer in preparation for a transfer onto a substrate, this layer comprising a surface topology and, therefore, variations in altitude or level, in a direction perpendicular to a plane defined by the thin layer, this process comprising:
a) the formation, on the thin layer to be transferred, of a layer of adhesive material, the thickness E of which has a value making it possible to perform at least one (and possibly n, n being an integer, n>1, for example, n=2 or 3) step of leveling off and/or conditioning of the surface;
b) a step of leveling off (or planarization) and/or conditioning the surface;
c) a step of assembling, preferably by molecular bonding, the layer of adhesive material with the substrate; assembling is preferably made by molecular bonding;
d) a step of detecting defects on the bonding interface; and
e) a step of separating the substrate at the bonding interface and the adhesive layer surface and a return to step b), when the presence of defects is detected at the bonding interface, or the end of the preparation method.

The second wafer, or final substrate, itself may carry a bonding or adhesive layer, which may also undergo the treatment described above.

The final substrate may comprise a surface topology and, therefore, variations in altitude or level, in a direction perpendicular to a plane defined by the final substrate.

An adhesive layer on the final substrate may have a thickness making it possible to perform at least one step of leveling off (or planarization) and/or conditioning of its surface. In addition, before step c), a step of leveling off and/or conditioning of the surface of the adhesive layer on the final substrate may be performed.

Another object of the invention is a process of preparing a layer and a final substrate in preparation for a transfer of the layer onto the final substrate, the layer having a surface topology and, therefore, variations in altitude or level, in a direction perpendicular to a plane defined by the thin layer, the process comprising:
a) the formation, on the thin layer to be transferred, of a layer of adhesive material and, on the final substrate, a layer of adhesive material whose thickness E has a value making it possible to perform at least one step (and possibly n, n being an integer, n>1, n=2 or 3, for example) of leveling off and/or conditioning the surface;
b) a step of leveling off (or planarization) and/or conditioning the surface of the adhesive layer formed on final substrate;
c) a step of assembling the layer of adhesive material formed on the thin layer, with the layer of adhesive material formed on the final substrate; assembling is preferably made by molecular bonding;
d) a step of detecting defects on the bonding interface; and
e) a step of separating the layer of adhesive material formed on the final substrate and the adhesive layer surface formed on the thin layer at the bonding interface, and a return to step b), when the presence of defects at the bonding interface is detected, or the end of the preparation method.

The final substrate may comprise a surface topology and, therefore, variations in altitude or level, in a direction perpendicular to a plane defined by the final substrate.

In all cases it is, therefore, possible to detach the layer from the substrate in order to recondition the bonding surface or surfaces or layers in order to assemble them once again and to obtain, after one or more of the above cycles, a bonding interface of good quality. The initial wafer and/or the initial substrate, or their respective bonding layers, may be reworked in preparation for obtaining good surfaces for bonding.

If there are two bonding layers, the wafer that has an added value, that is to say, the thin layer if it comprises circuits, will preferably be reworked. The second wafer 8 may be a wafer without defect.

This separation of the substrate and bonding layer and the new polishing step may, therefore, be performed at least twice.

After each leveling off (or planarization) and/or conditioning step, enabling removal of all or part of the surface, and before bonding, a second surface treatment such as leveling (or planarization) and/or polishing can be applied, possibly followed by cleaning. This second surface treatment may be different from the first leveling off (or planarization) and/or conditioning step, through a shorter polishing duration, and/or a lower compression force applied, and/or the use of another consumable, such as another tissue or abrasive.

A process of transferring a layer onto a substrate, according to the invention, comprises a preparation process as disclosed above, the thin layer being initially on a support. This transfer process also comprises the removal of all or part of an initial support on which the thin layer was produced.

In any embodiment of the invention, an adhesive layer is selected in view of the bonding or of the assembly to be made. It is, for example, a layer of oxide, such as a silicon oxide (stoichiometric or not) or a silicon oxynitride.

In any embodiment of the invention, the initial thickness of the adhesive layer can be selected so that n polishing steps, for example, n=2 or 3, will be able to be performed. Preferably, each polishing step is able to remove at a maximum approximately 1 µm of material of the adhesive layer, for example, 0.2 µm to 0.5 µm. Each polishing step is followed by assembly and checking of the quality of the interface. Should the interface have defects, or a substantial number of defects, another polishing step can be carried out.

A process according to the invention can be stopped when the bonding interface is considered satisfactory or if no defects or only a few defects are detected at the bonding interface.

In any embodiment of the invention, it is possible to have a layer of adhesive material whose thickness E has a value making it possible to perform in at least n steps (n being an integer, n>1, n=2 or 3, for example) of leveling off and/or conditioning the surface, whereas only n−1 or only n−2 or only n−p (p integer, $1 \leq p < n$) planarization and/or conditioning step and detection step are performed, the interface having no defects or very few defects after n−p planarization and/or conditioning step. Part of the initial adhesive layer remains on the thin layer to be transferred after the n leveling off and/or conditioning steps.

DETAILED DESCRIPTION OF THE INVENTION

Figure 2A:
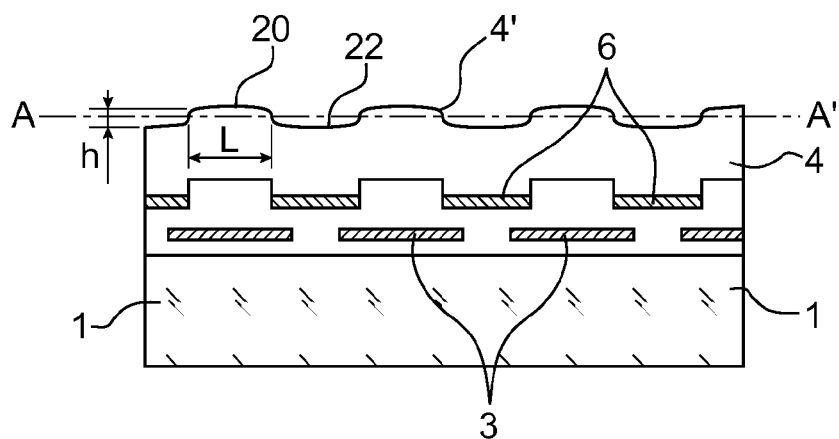
FIGS. 2A and 2B illustrate the topology of the bonding surface and the problems that may stem from this.
Figure 2B:
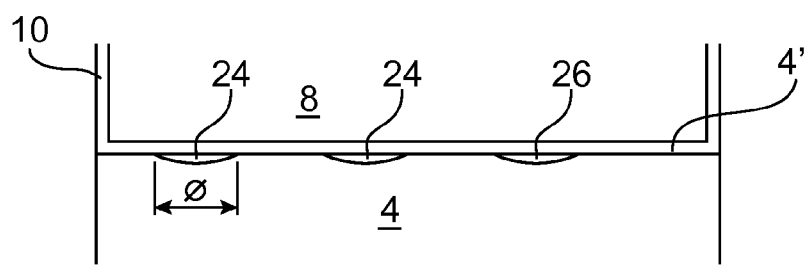

According to the invention, a structure of the same type as that in FIG. 2A is considered and, therefore, has, on a microscopic scale, a topology that may be very marked, as illustrated in FIG. 2B. This topology results, as has been seen, from the topology of the thin layer 5 containing the circuits 3, 6. The component or components of the circuits 3, 6 of the thin layer 5 may be of the electronic and/or optical circuit type, and/or of the microsystem type, one or more of the functionalities of the component or components possibly being able to be controlled by contacts, not shown in the figure.

The topology is defined as differences in altitudes or levels between the elevated zones and the low zones of the thin layer (with reference to a direction perpendicular to a plane defined by the thin layer), which correspond, for example, to several levels of metal or, more generally, to several levels in different zones in which different materials can be stacked. This definition of the topology, through its amplitude, may possibly be supplemented by the surface distribution of the topology, and/or the frequency of the topology and/or ratio of the topology in relief to the whole of the surface.

Figure 1A:
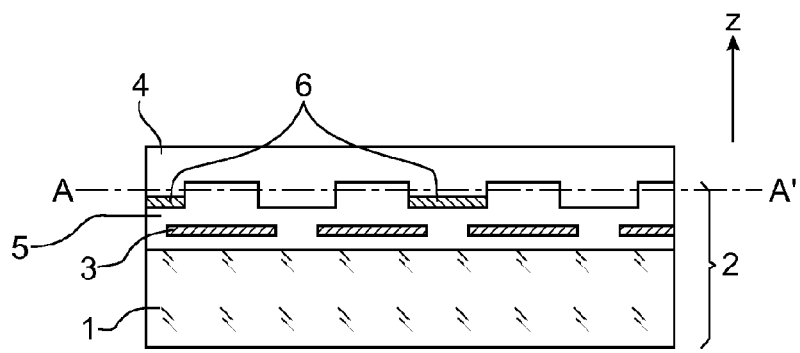
FIGS. 1A to 1D depict steps of a known simple transfer method.
Figure 1B:
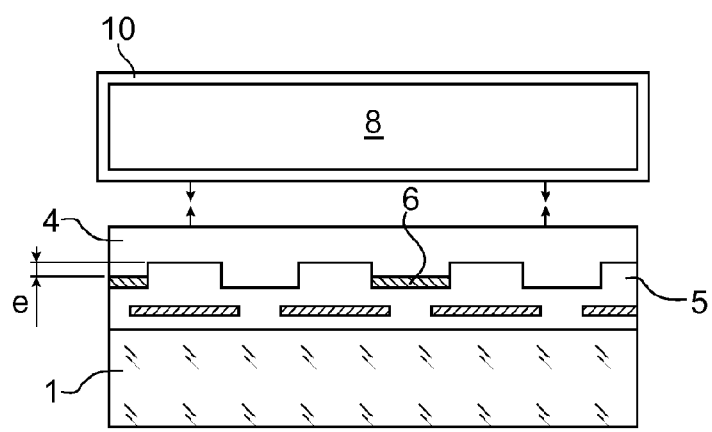

The differences in level may attain a value (in a direction z perpendicular to a plane defined by the layer 5 and represented by a line A-A' in FIG. 1A) of around several µm, these are, for example, between 0.5 µm and a few µm, for example, between 0.5 µm and 5 µm or between 0.5 µm and 10 µm.

This maximum difference in level essentially reflects the difference h between the highest point of the surface and the lowest point of the surface, of which it will be sought to take into account in order to define the thickness of the adhesive layer 4, which will then be sought to be leveled off over its entire surface.

The initial thickness of this adhesive layer 4 of adhesive material is chosen so as to enable performance of leveling off and/or conditioning step or a plurality of leveling off and/or conditioning steps on its surface, in order to eliminate any defect or "void" 24, 26, in preparation for an assembly by bonding of the molecular kind with the second wafer 8. Part of the initial adhesive layer 4 remains after the leveling off and/or conditioning step or the plurality of leveling off and/or conditioning steps.

A single leveling off or polishing step will enable removal of approximately 1 µm of thickness of the adhesive layer 4. This removal may vary according to the duration of the polishing step and the polishing process used, in particular, the consumables, tissues, and abrasives used.

For example, the application of two polishing and conditioning steps allows removal of a thickness of adhesive layer 4 comprised between 1 µm and 5 µm. The thicknesses to be removed are adapted according to the size of the topology defects to be eliminated.

Figure 3:
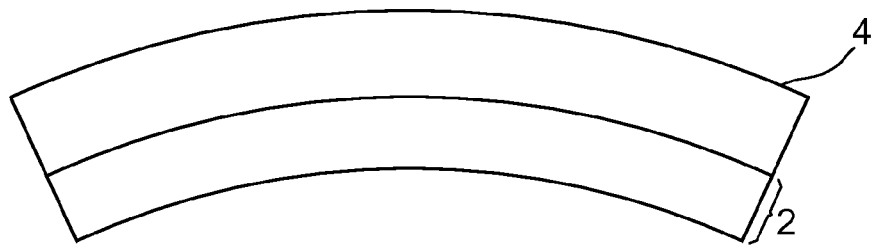
FIG. 3 depicts a situation of flexing of a wafer under an excessively great thickness of bonding material.

In this example, an initial thickness of the adhesive layer 4 lying, for example, between 0.5 µm and 10 µm will, therefore, be chosen. Another aspect may have to be taken into account for choosing the thickness of adhesive layer 4. This aspect will be explained in relation to FIG. 3, in which reference numeral 2 designates a global stack comprising, as in FIG. 1A, a treated thin layer 5 on substrate 1. As explained above, the front face of thin layer 5 is intended to be bonded with a second wafer 8 by means of adhesive layer 4 of adhesive material. The latter, as from a certain critical thickness, which may be situated at a maximum at approximately 10 µm or 12 µm, may give rise to stresses resulting in a deformation (of the bow or warp type) of the thin layer to be transferred. This deformation is shown in FIG. 3, in an exaggerated fashion.

This deformation is detrimental for obtaining good bonding for good alignment between the wafers 2, 8 to be assembled since it may cause the deformation of the transferred layer. Preferably, the thickness of the adhesive layer 4 is, therefore, limited to a value that does not risk causing this deformation of the wafer. A value of E below 10 µm or 12 µm corresponds to requirements in the field of treating semiconductor wafers.

The surface 4' of this adhesive layer 4 has a topology that reflects that of thin layer 5, with similar differences in level or amplitudes, for example, between 0.5 µm and a few µm, for example, between 0.5 µm and 5 µm or between 0.5 µm and 10 µm.

The invention can apply also to the case where the layers are structured but "homogeneous," for example, in the case of thin layer 5, without circuits 3, 6, having zones, none of which are metallic, these different zones having a surface topology and, therefore, variations in altitude as explained above and, in particular, in the ranges indicated above.

The adhesive layer 4 of adhesive material is, for example, a layer of oxide, such as a silicon oxide (stoichiometric or not) or a silicon oxynitride.

The material of this adhesive layer 4 is chosen for its bonding qualities, which will be reinforced by preparation of the surface finish of this layer, such as a new surface activation step, for example, a mechanical/chemical polishing.

Figure 1C:
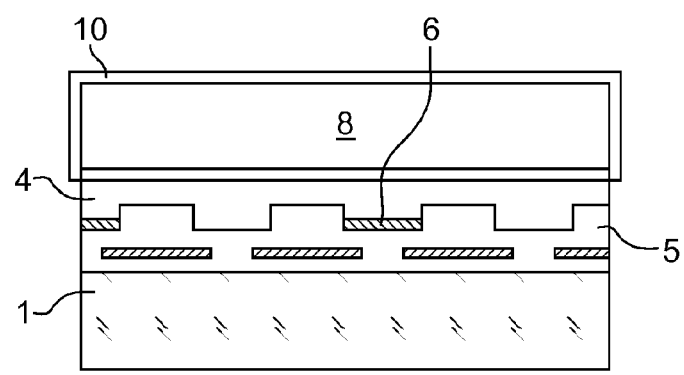
Figure 1D:
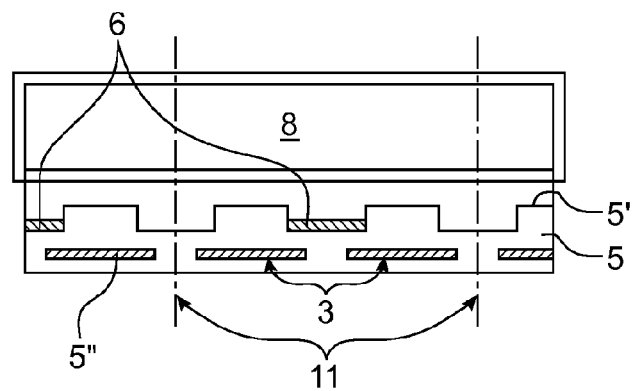

After this step of preparing the surface finish, assembly with the second wafer 8 can be carried out, as illustrated in FIG. 1D.

This second wafer 8 can be subjected to a heat treatment step. Both the surface of the adhesive material and that of the oxide can be made hydrophilic, with a view to assembly by molecular adhesion.

After assembly, and before the application of any heat treatment for consolidating the bonding interface, it is possible to check the quality of the interface between the adhesive layer and the second wafer or final substrate 8. For this purpose, it is possible to use techniques such as, for example, acoustic microscopy or infrared imaging or microscopy, as described in the document WO2005/064320. The infrared technique has the advantage of being quicker than the acoustic microscopy technique, even if the resolution is worse.

If this identification step reveals bonding defects (due to surface defects or to "voids" 24, 26 on the surface of the assembled wafers and more probably on the surface of the flattened circuit wafer), the second wafer or final substrate 8 is separated once again from the adhesive layer 4, and once again a step of leveling off and/or conditioning of the surface of the latter is carried out in order to eliminate a maximum number of defects.

The initial thickness of the adhesive layer 4 is, therefore, designed so that a plurality, for example, two or three, or n (n>3) polishing steps will be able to be performed. Each step is followed, or can be followed, by assembly and checking of the quality of the interface. If the quality is not satisfactory, then the wafers are separated at the bonding interface as explained above and another polishing step is performed, and then the wafers are assembled again. A further detection step can also be performed. Preferably, each step is able to remove, at a maximum, approximately 1 µm of material of the adhesive layer 4, more generally 0.2 µm to 0.5 µm.

After these various preparation steps, the final assembly with the second wafer or final substrate 8 can be carried out, as illustrated in FIG. 1C. After this assembly with the second wafer or final substrate 8, all or part of the initial substrate 1 can be removed, giving access to the rear face 5" of the thin layer 5 (FIG. 1D).

The second wafer or final substrate 8 can be a solid substrate or a multilayer structure. It may also correspond to a substrate having a surface topology, for example, on or in which some circuits are already present. This substrate can be subjected to the same leveling off treatment as first wafer 2 according to the present invention.

If there is also a bonding layer on the second wafer or final substrate 8, the interface after separation will be situated between the two adhesive layers.

In a variant, it is surface layer 10 on the second wafer or final substrate 8 that undergoes a treatment according to the invention, and which has a thickness E making it possible to perform at least one step of leveling off and/or conditioning of surface layer 10. The thickness E can be, in particular, chosen in ranges or limits indicated above, so as to allow one or more or n (n>1) polishing and/or conditioning steps. The other steps already described above are implemented: assembly, fault detection, separation and, once again, polishing and/or conditioning of surface layer 10, several times if necessary.

In general terms, the separation occurs at the bonding interface since this has not yet been subjected to heat treatment to reinforce the bonding energy and, therefore, can be dismantled. Thus, in the case in FIG. 2B, the separation occurs at the surface 4' of the adhesive layer 4.

This assembly can then be subjected to a heat treatment step after or, preferably, before the removal of the initial substrate 1, in order to reinforce the bonding between the adhesive layer 4 and the second wafer or final substrate 8. Both the surface 4' of the adhesive material and that of the surface layer of oxide 10 of the second wafer or final substrate 8 will preferably have undergone cleaning steps after the leveling off in preparation for a molecular assembly.

The invention claimed is:

1. A method of preparing a thin layer in preparation for a transfer onto a substrate, the thin layer comprising a surface topology including variations in altitude in a direction perpendicular to a plane defined by the thin layer, the method comprising:
   forming a layer of adhesion material on the thin layer, the layer of adhesion material on the thin layer having a thickness having an initial value enabling performance of at least one step of leveling of the surface of the adhesion material on the thin layer;
   leveling the surface of the adhesion material on the thin layer;
   assembling the layer of adhesion material on the thin layer with the substrate;
   detecting defects at a bonding interface between the layer of adhesion material and the substrate;
   separating the substrate and the thin layer at the bonding interface; and
   again leveling the surface of the adhesion material on the thin layer.

2. The method of claim 1, further comprising forming an adhesive layer on the substrate.

3. The method of claim 2, wherein the substrate has a surface topology including variations in altitude in a direction perpendicular to a plane defined by the substrate.

4. The method of claim 3, wherein the adhesive layer on the substrate has a thickness enabling performance of at least one step of leveling of the surface of the adhesive layer on the substrate.

5. The method of claim 4, further comprising leveling the surface of the adhesive layer on the substrate prior to assembling the layer of adhesion material on the thin layer with the substrate.

6. The method of claim 1, wherein the actions of separating the substrate and the thin layer at the bonding interface and again leveling the surface of the adhesion material on the thin layer are performed at least twice.

7. The method of claim 1, wherein the initial value of the thickness of the layer of adhesion material on the thin layer is less than 10 µm.

8. The method of claim 7, wherein the initial value of the thickness of the layer of adhesion material on the thin layer is greater than 0.5 µm.

9. The method of claim 1, wherein the thin layer is initially on a support substrate, and wherein the method further comprises removal of at least a portion of the support substrate.

10. The method of claim 1, wherein assembling the layer of adhesion material on the thin layer with the substrate comprises attaching the thin layer to the substrate using molecular adhesion.

11. The method of claim 1, wherein the layer of adhesion material on the thin layer comprises an oxide.

12. The method of claim 11, wherein the layer of adhesion material on the thin layer comprises a silicon oxide ($SiO_x$) or a silicon oxynitride ($SiO_xN_y$).

13. The method of claim 1, wherein the variations in altitude of the topology of the surface of the thin layer have a maximum amplitude of less than 10 μm.

14. The method of claim 13, wherein the variations in altitude of the topology of the surface of the thin layer have a maximum amplitude of between 1 μm and 5 μm.

15. A method of preparing a thin layer and a substrate in preparation for transferring the thin layer onto the substrate, the thin layer having a surface topology including variations in altitude in a direction perpendicular to a plane defined by the thin layer, the method comprising:
provided a layer of adhesion material on the thin layer and another layer of adhesion material on the substrate, the layer of adhesion material on the thin layer and the another layer of adhesion material on the substrate each having a respective thickness having an initial value enabling performance of at least one step of leveling of at least one of a surface of the layer of adhesion material on the thin layer and a surface of the another layer of adhesion material on the substrate;
leveling at least one of the surface of the layer of adhesion material on the thin layer and the surface of the another layer of adhesion material on the substrate;
assembling the layer of adhesion material on the thin layer and the another layer of adhesion material on the substrate;
detecting defects at a bonding interface between the layer of adhesion material on the thin layer and the another layer of adhesion material;
separating the another layer of adhesion material on the substrate and the layer of adhesion material on the thin layer at the bonding interface; and
again leveling at least one of the surface of the layer of adhesion material on the thin layer and the surface of the another layer of adhesion material on the substrate.

16. The method of claim 15, wherein the substrate has a surface topology including variations in altitude in a direction perpendicular to a plane defined by the substrate.

17. The method of claim 15, wherein the actions of separating the another layer of adhesion material on the substrate and the layer of adhesion material on the thin layer at the bonding interface and again leveling at least one of the surface of the layer of adhesion material on the thin layer and the surface of the another layer of adhesion material on the substrate are performed at least twice.

18. The method of claim 15, wherein the initial value of the respective thicknesses of the layer of adhesion material on the thin layer and the another layer of adhesion material on the substrate is less than 10 μm.

19. The method of claim 18, wherein the initial value of the respective thicknesses of the layer of adhesion material on the thin layer and the another layer of adhesion material on the substrate is greater than 0.5 μm.

20. The method of claim 15, wherein detecting defects at the bonding interface comprises using acoustic microscopy or infrared microscopy for detecting defects at the bonding interface.

21. The method of claim 15, wherein the thin layer is initially on a support substrate, and wherein the method further comprises removal of at least a portion of the support substrate.

22. The method of claim 15, wherein assembling the layer of adhesion material on the thin layer and the another layer of adhesion material on the substrate comprises bonding the layer of adhesion material on the thin layer and the another layer of adhesion material on the substrate using molecular adhesion.

23. The method of claim 15, wherein at least one of the layer of adhesion material on the thin layer and the another layer of adhesion material on the substrate comprises an oxide.

24. The method of claim 23, wherein at least one of the layer of adhesion material on the thin layer and the another layer of adhesion material on the substrate comprises a silicon oxide ($SiO_x$) or a silicon oxynitride ($SiO_xN_y$).

25. The method of claim 15, wherein the variations in altitude of the topology of the surface of the thin layer have a maximum amplitude of less than 10 μm.

26. The method of claim 15, further comprising at least one of polishing and cleaning the at least one of the surface of the layer of adhesion material on the thin layer and the surface of the another layer of adhesion material on the substrate after leveling the at least one of the surface of the layer of adhesion material on the thin layer and the surface of the another layer of adhesion material on the substrate and prior to assembling the layer of adhesion material on the thin layer and the another layer of adhesion material on the substrate.

27. The method of claim 26, wherein the variations in altitude of the topology of the surface of the thin layer have a maximum amplitude of between 1 and 5 μm.

28. The method of claim 16, wherein the thin layer comprises components.

29. The method of claim 28, wherein the components comprise components of at least one of an electronic circuit and an optical circuit for a micro system.

* * * * *